United States Patent
Okabe et al.

(10) Patent No.: US 10,581,238 B2
(45) Date of Patent: Mar. 3, 2020

(54) STORAGE BATTERY DEVICE, STORAGE BATTERY DEVICE CONTROL METHOD, AND COMPUTER PROGRAM PRODUCT

(71) Applicants: Kabushiki Kaisha Toshiba, Minato-ku (JP); Toshiba Infrastructure Systems & Solutions Corporation, Kawasaki-shi (JP)

(72) Inventors: Ryo Okabe, Hino (JP); Norihiro Kaneko, Nerima (JP); Yusuke Kikuchi, Kawasaki (JP); Takayuki Onoda, Kunitachi (JP); Kazuto Kuroda, Arakawa (JP); Masahiro Sekino, Shinjuku (JP); Jun Takahashi, Kunitachi (JP)

(73) Assignees: Kabushiki Kaisha Toshiba, Minato-ku (JP); Toshiba Infrastructutre Systems & Solutions Corporation, Kawasaki-shi (JP)

( * ) Notice: Subject to any disclaimer, the term of this patent is extended or adjusted under 35 U.S.C. 154(b) by 0 days.

(21) Appl. No.: 16/082,898

(22) PCT Filed: Mar. 9, 2016

(86) PCT No.: PCT/JP2016/057431
§ 371 (c)(1),
(2) Date: Sep. 6, 2018

(87) PCT Pub. No.: WO2017/154146
PCT Pub. Date: Sep. 14, 2017

(65) Prior Publication Data
US 2019/0089147 A1    Mar. 21, 2019

(51) Int. Cl.
*H02J 7/00* (2006.01)
*H02H 7/18* (2006.01)
(Continued)

(52) U.S. Cl.
CPC ......... *H02H 7/18* (2013.01); *G01R 19/16542* (2013.01); *H01M 10/425* (2013.01);
(Continued)

(58) Field of Classification Search
CPC .................................................. H02J 7/0026
(Continued)

(56) References Cited

U.S. PATENT DOCUMENTS

2016/0243954 A1* 8/2016 Moro ................... H02H 7/18

FOREIGN PATENT DOCUMENTS

JP         2014-239630 A    12/2014

OTHER PUBLICATIONS

International Search Report dated May 10, 2016 in PCT/JP2016/057431 filed Mar. 9, 2016.

* cited by examiner

*Primary Examiner* — Edward Tso
*Assistant Examiner* — Ahmed H Omar
(74) *Attorney, Agent, or Firm* — Oblon, McClelland, Maier & Neustadt, L.L.P.

(57) ABSTRACT

A storage battery device includes a battery unit, a first circuit breaker, a second circuit breaker, and a control unit. The first circuit breaker switches between connecting and disconnecting a first-electrode side of the battery unit and an external device. The second circuit breaker switches between connecting and disconnecting a second-electrode side of the battery unit and the external device. The control unit supplies power to the first circuit breaker and the second circuit breaker in sequence with the power supplied to the second circuit breaker offset relative to the power supplied to the first circuit breaker by a time period equal to or longer than a time difference required for a sum of currents flowing through the first circuit breaker and the second circuit
(Continued)

breaker to reach an upper bound current that is set as an upper bound of a current.

6 Claims, 3 Drawing Sheets

(51) Int. Cl.
*H02J 1/00* (2006.01)
*G01R 19/165* (2006.01)
*H01M 10/42* (2006.01)
*H01M 10/48* (2006.01)

(52) U.S. Cl.
CPC .............. *H01M 10/48* (2013.01); *H02J 1/00* (2013.01); *H02J 7/00* (2013.01); *H02J 7/0029* (2013.01); *H01M 2010/4271* (2013.01); *H02J 2007/0039* (2013.01)

(58) Field of Classification Search
USPC ........................................................ 320/134
See application file for complete search history.

US 10,581,238 B2

STORAGE BATTERY DEVICE, STORAGE BATTERY DEVICE CONTROL METHOD, AND COMPUTER PROGRAM PRODUCT

CROSS-REFERENCE TO RELATED APPLICATIONS

This application is national stage application of International Application No. PCT/JP2016/057431, filed Mar. 9, 2016, which designates the United States, incorporated herein by reference, the entire contents of which are incorporated herein by reference.

FIELD

Embodiments described herein relate generally to a storage battery device, a storage battery device control method, and a computer program product.

BACKGROUND

Conventionally known is a storage battery device including one or more battery modules, a plurality of circuit breakers that connect or disconnect the battery modules and external equipment, and a management unit that controls the circuit breakers.

In such a device, the management unit adjusts the power to be discharged by switching the circuit breakers between a connected state and a disconnected state.

DETAILED DESCRIPTION

Figure 1:
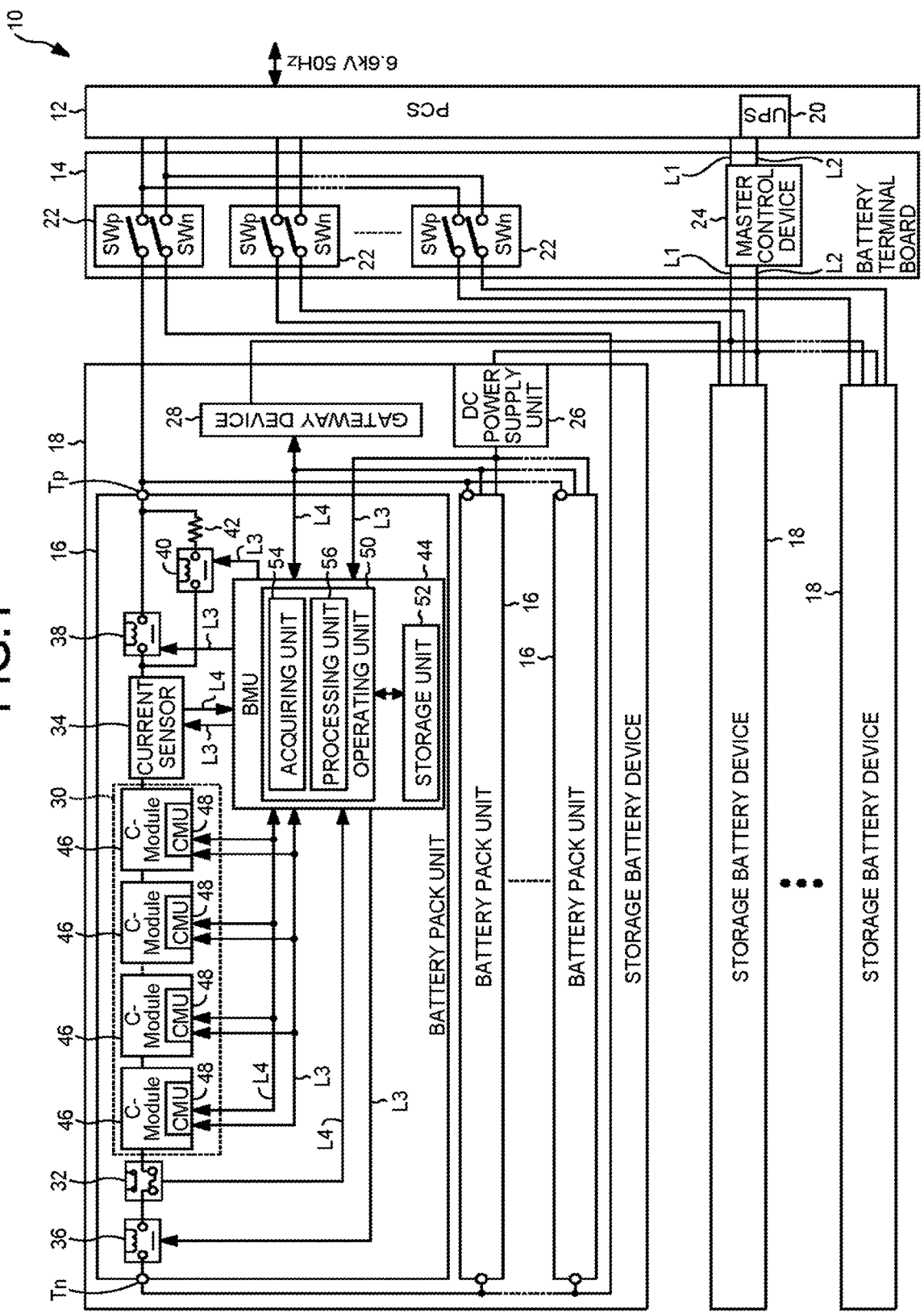
FIG. 1 is a schematic of an overall configuration of a storage battery system according to an embodiment.

According to an embodiment, a storage battery device includes a battery unit, a first circuit breaker, a second circuit breaker, and a control unit. The battery unit includes one or more storage batteries. The first circuit breaker switches between connecting and disconnecting a first-electrode side of the battery unit and an external device. The second circuit breaker switches between connecting and disconnecting a second-electrode side of the battery unit and the external device. The control unit controls connection and disconnection by supplying power to the first circuit breaker and the second circuit breaker. The control unit supplies power to the first circuit breaker and the second circuit breaker in sequence with the power supplied to the second circuit breaker offset relative to the power supplied to the first circuit breaker by a time period equal to or longer than a time difference required for a sum of currents flowing through the first circuit breaker and the second circuit breaker to reach an upper bound current that is set as an upper bound of a current.

Some exemplary embodiments and modifications described below include the same elements. Therefore, in the explanation hereunder, the same reference numerals are assigned to the same elements, and redundant explanations thereof will be partly omitted. A part that is included in one embodiment or modification may be replaced with a corresponding part included in another embodiment or modification. Furthermore, unless specified otherwise, a configuration, a position, and the like of a part included in one embodiment or modification are the same as those in the other embodiment or modification.

Embodiment

FIG. 1 is a schematic of an overall configuration of a storage battery system 10 according to the embodiment. The storage battery system 10 is connected to a power system, such as an external commercial power supply, via a transformer, for example, and discharges power to the power system, and is charged with the power supplied from the power system. As illustrated in FIG. 1, the storage battery system 10 includes a power conditioning system (PCS) 12, a battery terminal board 14, and one or more (e.g., sixteen) storage battery devices 18 that include battery pack units 16.

The PCS 12 converts the DC power supplied from the storage battery devices 18 to AC power having a frequency and a voltage suitable for the power system, and discharges the AC power to the power system. The PCS 12 converts the AC power supplied from the power system into DC power at a voltage that is chargeable by the storage battery devices 18, and supplies the DC power to the storage battery devices 18. One example of the AC power supplied from the power system is one having a voltage of 6.6 kilovolts and a frequency of 50 hertz. The PCS 12 is connected to a control communication line L1 providing Ethernet (registered trademark), for example. The PCS 12 has an uninterruptible power system (UPS) 20. The UPS 20 is connected to a control power supply line L2. The UPS 20 keeps supplying power to the storage battery devices 18 for a certain length of time even when the power supply from the external power system stops.

The battery terminal board 14 includes one or more switch circuits 22 and a master control device 24.

The number of switch circuits 22 is the same as the number of the storage battery devices 18. The switch circuits 22 are provided correspondingly to the respective storage battery devices 18. Each of the switch circuit 22 has a positive-electrode side switching member SWp and a negative-electrode side switching member SWn. The switching members SWp, SWn are opened and closed manually, for example. The positive-electrode side switching member SWp connects or disconnects the positive-electrode side terminal Tp of each one of the battery pack units 16 that are included in one of the storage battery devices 18, and the PCS 12. The negative-electrode side switching member SWn connects or disconnects the negative-electrode side terminal Tn of each one of the battery pack units 16 that are included in one of the storage battery devices 18, and the PCS 12. The positive-electrode side terminal Tp and the negative-electrode side terminal Tn of the battery pack unit 16 will be described later. The voltage between one switching member SWp and the other switching member SWn is set to a range from 490 volts to 778 volts or so, for example.

The master control device 24 is a computer including a transmitter/receiver for communicating with the external, a micro-processor, and a storage device, for example. The master control device 24 monitors and controls the conditions of the battery pack units 16. The master control device 24 is connected to the control communication line L1 that is connected to the PCS 12 and to the control power supply line L2 that is connected to the UPS 20. The master control device 24 transmits and receives control information to and from the PCS 12 via the control communication line L1 over Ethernet (registered trademark), for example. The master control device 24 supplies, in case of a power failure, for example, the power supplied from the UPS 20 to the storage battery devices 18, via the control power supply line L2.

The storage battery device 18 includes a DC power supply unit 26, a gateway device 28, and one or more battery pack units 16.

The DC power supply unit 26 is connected to the master control device 24 and the UPS 20 via the control power supply line L2. The DC power supply unit 26 is supplied with 100-volt AC power, for example, that is supplied from the UPS 20 to the master control device 24, in case of a power failure, via the control power supply line L2. The DC power supply unit 26 then supplies 12-volt DC power, for example, to the battery pack unit 16.

The gateway device 28 is bidirectionally communicatively connected to the master control device 24 via the control communication line L1. The gateway device 28 communicates with the master control device 24 over Ethernet (registered trademark), for example. The gateway device 28 transmits and receives control information to and from the master control device 24, for example. The gateway device 28 is bidirectionally communicatively connected to the battery pack units 16. The gateway device 28 governs the overall control of the battery pack units 16 based on information related to voltages, currents, temperatures, and the like received from the battery pack units 16, and the control information, for example.

The battery pack unit 16 includes a battery system 30, a service disconnector 32, a current sensor 34, a negative-electrode side circuit breaker 36, a positive-electrode side circuit breaker 38, a pre-charge circuit breaker 40, a pre-charge resistor 42, and a battery management unit (BMU) 44 that is one example of a control unit.

The battery system 30 includes one or more (e.g., 24) battery modules 46 and one or more cell monitoring units (CMUs) 48. The battery system 30 is one example of a battery unit.

The battery module 46 is one example of a storage battery. The battery module 46 is also referred to as a cell module. The battery modules 46 are connected serially. The battery modules 46 have 24 rechargeable secondary batteries, such as lithium-ion batteries (20 ampere hour-2.4 volts). Two out of the 24 lithium-ion batteries are connected in parallel, and 12 pairs, each pair of which including two lithium-ion batteries connected in parallel, are serially connected. In FIG. 1, the left side of the battery system 30 represents the negative-electrode side, and the right side of the battery system 30 represents the positive-electrode side.

The number of the CMUs 48 is the same as the number of the battery modules 46. The CMUs 48 are provided correspondingly to the respective battery modules 46. The CMU 48 includes a transmitting/receiving unit that communicates with the BMU 44, a micro-processor that executes a program, and a storage unit that stores therein the program and information such as voltage information and temperature information of the battery module 46. The CMU 48 detects the voltage and the temperature of the battery module 46, and transmits the information to the BMU 44.

The service disconnector 32 is serially connected to the negative-electrode side of the battery system 30. The service disconnector 32 includes a switch and a fuse. When any of the battery modules 46 are removed or attached due to a maintenance, for example, the service disconnector 32 enables a user to manually disconnect the battery system 30 from the external. If any one of the battery terminal board 14 and the PCS 12 includes a fuse, the fuse in the service disconnector 32 may be omitted. The service disconnector 32 is provided with a wiring for notifying the insertion/removal condition and the fuse condition to the BMU 44, which will be described later.

The current sensor 34 is serially connected to the positive-electrode side of the battery system 30. The current sensor 34 transmits a detection of a current to the BMU 44.

Each of the negative-electrode side circuit breaker 36, the positive-electrode side circuit breaker 38, and the pre-charge circuit breaker 40 includes a coil, for example, and is a contactor that is switched between a connected state and a disconnected state, by being supplied with power. The currents flowing through the negative-electrode side circuit breaker 36, the positive-electrode side circuit breaker 38, and the pre-charge circuit breaker 40 change as the time elapses while the states thereof are switched. Each of the negative-electrode side circuit breaker 36, the positive-electrode side circuit breaker 38, and the pre-charge circuit breaker 40 includes an auxiliary coil, and is preferably a contactor having an economizer circuit for reducing power consumption by allowing a current to flow therethrough intermittently, based on a reduction in contactor magnetism during a steady state subsequent to power-on. The negative-electrode side circuit breaker 36, the positive-electrode side circuit breaker 38, and the pre-charge circuit breaker 40 may also be relays or breakers (e.g., fuse-free breakers).

The negative-electrode side circuit breaker 36 is one example of a first circuit breaker. The negative-electrode side circuit breaker 36 is connected between the service disconnector 32 and the negative-electrode side terminal Tn of the battery pack unit 16. The negative-electrode side circuit breaker 36 is connected to the negative-electrode side of the battery system 30 via the service disconnector 32. The negative electrode is one example of a first electrode. The negative-electrode side circuit breaker 36 is connected to the negative-electrode side switching member SWn that is one example of an external device, via the negative-electrode side terminal Tn. The negative-electrode side circuit breaker 36 switches between connecting (or closed) and disconnecting (or open) the negative-electrode side of the battery system 30 and the negative-electrode side switching member SWn.

The positive-electrode side circuit breaker 38 is one example of a second circuit breaker. The positive-electrode side circuit breaker 38 is connected between the current sensor 34 and the positive-electrode side terminal Tp of the battery pack unit 16. The positive-electrode side circuit breaker 38 is connected to the positive-electrode side of the battery system 30 via the current sensor 34. The positive electrode is one example of a second electrode. The positive-electrode side circuit breaker 38 is connected to the positive-electrode side switching member SWp that is one example of the external device, via the positive-electrode side terminal Tp. The positive-electrode side circuit breaker 38 switches between connecting (or closed) and disconnecting (or open) the positive-electrode side of the battery system 30 and the positive-electrode side switching member SWp.

The pre-charge circuit breaker 40 is one example of a third circuit breaker. One end of the pre-charge circuit breaker 40 is connected to the positive-electrode side of the battery system 30 via the current sensor 34. The other end of the pre-charge circuit breaker 40 is connected to the positive-electrode side terminal Tp of the battery pack unit 16 via the pre-charge resistor 42. The pre-charge circuit breaker 40 is connected in parallel with the positive-electrode side circuit breaker 38, on the positive-electrode side of the battery pack unit 16. The pre-charge circuit breaker 40 is connected to the positive-electrode side switching member SWp via the pre-charge resistor 42 and the positive-electrode side terminal Tp. The pre-charge circuit breaker 40 switches between connecting (or closed) and disconnecting (or open) the positive-electrode side of the battery system 30 and the positive-electrode side switching member SWp.

The pre-charge resistor 42 is one example of a preliminary resistor. The pre-charge resistor 42 is connected between the pre-charge circuit breaker 40 and the positive-electrode side terminal Tp of the battery pack unit 16. In other words, the pre-charge resistor 42 is connected serially to the pre-charge circuit breaker 40. To charge elements such as a capacitor in an inverter included in the PCS 12, the pre-charge resistor 42 reduces the current that flows at the time of start-up so that a surge current at the time of start-up is suppressed.

The BMU 44 is connected to the DC power supply unit 26 in a manner enabled to receive the DC power via a power supply line L3. The BMU 44 is connected to the CMUs 48 in the battery system 30, the current sensor 34, the negative-electrode side circuit breaker 36, the positive-electrode side circuit breaker 38, and the pre-charge circuit breaker 40 via the power supply lines L3, in a manner enabled to supply the DC power received from the DC power supply unit 26. For example, the BMU 44 supplies the power to the negative-electrode side circuit breaker 36, the positive-electrode side circuit breaker 38, and the pre-charge circuit breaker 40, and controls switching between connecting and disconnecting of the circuit breakers 36, 38, and 40.

The BMU 44 is connected with the gateway device 28 in a manner enabled to transmit and to receive information over Ethernet (registered trademark), for example, via a communication line L4. The BMU 44 is connected to the CMUs 48 in the battery system 30, the service disconnector 32, and the current sensor 34 in a manner enabled to transmit and to receive information via the communication lines L4, over a controller area network (CAN) communication that is based on the CAN standards.

The BMU 44 is, for example, a computer that includes an operating unit 50 that is a micro-processor executing a program, and a storage unit 52 storing therein a program, control information, and the like. The operating unit 50 communicates with an upper-level device, such as the gateway device 28, via a communication interface, for example. The storage unit 52 includes, for example, a random access memory (RAM), a read-only memory (ROM), a hard disk drive (HDD), and a solid state drive (SSD). The operating unit 50 functions as an acquiring unit 54 and a processing unit 56 by reading a program and information such as parameters stored in the storage unit 52. The acquiring unit 54 and the processing unit 56 may be, partly or entirely, implemented as hardware such as a circuit.

The acquiring unit 54 acquires control information from the gateway device 28. The acquiring unit 54 acquires voltage information and temperature information of the battery modules 46 from the CMUs 48. The acquiring unit 54 supplies the DC power to the current sensor 34, and acquires current information measured by the current sensor 34. The acquiring unit 54 acquires information such as information of the insertion/removal condition and the fuse condition of the service disconnector 32 from the service disconnector 32. The acquiring unit 54 acquires information related to an upper bound current Lt1 that is set as an upper bound of the sum of the currents flowing through the negative-electrode side circuit breaker 36, the positive-electrode side circuit breaker 38, and the pre-charge circuit breaker 40, from the storage unit 52. The acquiring unit 54 may also set the upper bound current Lt1 by acquiring the upper bound of the current of the DC power supply unit 26 from the DC power supply unit 26, as the information related to the upper bound current Lt1. In this manner, the information related to the upper bound current Lt1 may be the upper bound current Lt1 itself, or the upper bound of the current of the DC power supply unit 26.

The processing unit 56 controls the battery pack units 16 based on the information acquired by the acquiring unit 54.

Specifically, the processing unit 56 supplies or stops the supply of the DC power based on the control information or the like received from the gateway device 28 by the acquiring unit 54, and controls the closed state and the open state of the negative-electrode side circuit breaker 36, the positive-electrode side circuit breaker 38, and the pre-charge circuit breaker 40. If the processing unit 56 determines that the battery system 30 or the like has failed, for example, based on the voltage information, the temperature information, and the current information received from the CMU 48 and the current sensor 34, the processing unit 56 switches the negative-electrode side circuit breaker 36, the positive-electrode side circuit breaker 38, and the pre-charge circuit breaker 40 to open.

The processing unit 56 switches to supply power to the negative-electrode side circuit breaker 36, the positive-electrode side circuit breaker 38, and the pre-charge circuit breaker 40 at timings that are offset from one another. Specifically, the processing unit 56 switches between connecting and disconnecting of the negative-electrode side circuit breaker 36, the positive-electrode side circuit breaker 38, and the pre-charge circuit breaker 40 in sequence with each successive switching offset by a time period equal to or longer than a time difference required for a total current It that is the sum of the currents flowing through the negative-electrode side circuit breaker 36, the positive-electrode side circuit breaker 38, and the pre-charge circuit breaker 40 to reach the upper bound current Lt1 set as the upper bound of the current. The upper bound current Lt1 is, for example, 90 percent of the upper bound of the current that the DC power supply unit 26 is capable of supplying. It is preferable for the processing unit 56 to switch between connecting and disconnecting of the negative-electrode side circuit breaker 36, the positive-electrode side circuit breaker 38, and the pre-charge circuit breaker 40 in successive with each successive switching offset by a time period that is less than the time difference required for the total current It that is the sum of the currents flowing through the negative-electrode side circuit breaker 36, the positive-electrode side circuit breaker 38, and the pre-charge circuit breaker 40 to reach a lower bound current Lt2 set as a lower bound of the current. The lower bound current Lt2 is, for example, 90 percent of the upper bound current Lt1.

Figure 2:
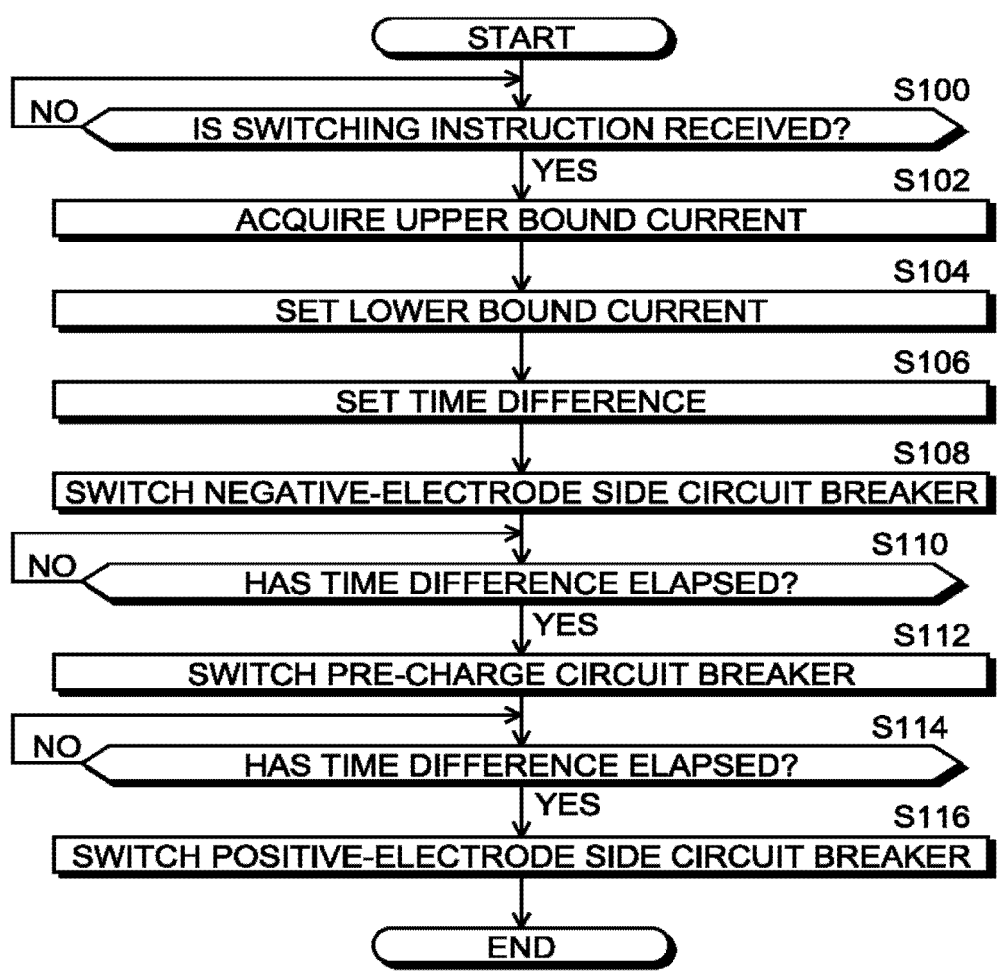
FIG. 2 is a flowchart of a switching process of switching to a closed state (or an open state), performed by a battery management unit.

FIG. 2 is a flowchart of a process of switching to the closed state (or to the open state), performed by the BMU 44. The switching process is one example of a control method executed by the BMU 44. For example, the operating unit 50 starts the flowchart by reading a program that corresponds to the switching process.

As illustrated in FIG. 2, in the switching process, the acquiring unit 54 determines whether the control information giving a switching instruction has been received from the gateway device 28 (S100). The acquiring unit 54 is kept standby until the switching instruction is received from the gateway device 28 (No at S100).

If the switching instruction has been received (e.g., an instruction for switching to the closed state) (Yes at S100), the acquiring unit 54 acquires the upper bound current Lt1 (S102). The acquiring unit 54 acquires the upper bound current Lt1 from the storage unit 52 where the upper bound current Lt1 has been stored in advance. The acquiring unit 54 may also set the upper bound current Lt1 based on the upper bound of the current of the DC power supply unit 26, acquired from the DC power supply unit 26.

The processing unit 56 sets the lower bound current Lt2 based on the upper bound current Lt1 acquired by the acquiring unit 54 (S104). For example, the processing unit 56 sets a value at 90 percent of the upper bound current Lt1 as the lower bound current Lt2.

The processing unit 56 then sets a time difference TL (S106). Specifically, the processing unit 56 sets the time difference TL based on a current profile In(t) of the negative-electrode side circuit breaker 36, a current profile Ip(t) of the positive-electrode side circuit breaker 38, a current profile Ipr(t) of the pre-charge circuit breaker 40 that are stored in the storage unit 52, and the upper bound current Lt1 and the lower bound current Lt2. For example, the processing unit 56 calculates the sum of the current profile In(t) of the negative-electrode side circuit breaker 36, the current profile Ipr(t) of the pre-charge circuit breaker 40 with an offset of an extremely small time length $\Delta t$ added to the current profile In(t) of the negative-electrode side circuit breaker 36, and the current profile Ip(t) of the positive-electrode side circuit breaker 38 with an offset of the extremely small time length $\Delta t$ added to the current profile Ipr(t) of the pre-charge circuit breaker 40, as the total current It(t), as indicated in Equation (1).

$$It = In(t) + Ipr(t+\Delta t) + Ip(t+2\Delta t) \quad (1)$$

The processing unit 56 then determines whether a peak current It_max of the total current It is equal to or lower than upper bound current Lt1, as indicated in Equation (2) below.

$$Lt1 \geq It\_max \quad (2)$$

If the peak current It_max of the total current It is higher than the upper bound current Lt1, the processing unit 56 adds another offset of the extremely small time length $\Delta t$, calculates the total current It, and determines whether the peak current It_max of the total current It is still higher than the upper bound current Lt1. In this manner, the processing unit 56 repeats calculating the total current It after adding another offset of the extremely small time length $\Delta t$ until the peak current It_max of the total current It becomes equal to or lower than the upper bound current Lt1. The total current It with n offsets of the extremely small time length $\Delta t$ can be expressed as Equation (3) below.

$$It = In(t) + Ipr(t+n\Delta t) + Ip(t+2n\Delta t) \quad (3)$$

If the first peak current It_max of the total current It having been determined to be equal to or lower than the upper bound current Lt1 is lower than the lower bound current Lt2, the processing unit 56 sets n$\Delta t$ that is the total sum of the extremely small time lengths $\Delta t$ with which the total current It is calculated, as the time difference TL. In this manner, the processing unit 56 sets time that is equal to or longer than the time required for the total current It to reach the upper bound current Lt1, and that is less than the time required for the total current It to reach the lower bound current Lt2, as the time difference TL. If the total current It is lower than the lower bound current Lt2, the processing unit 56 may repeat the calculation of the total current It from the beginning, by reducing the length of extremely small time length $\Delta t$.

If the time difference TL has been set and stored in the storage unit 52 in advance, the acquiring unit 54 and the processing unit 56 may omit execution of Steps S102, S104, and S106.

The processing unit 56 then switches the negative-electrode side circuit breaker 36 to the closed state, for example (S108). As a result, the negative-electrode side of the battery system 30 becomes connected to the negative-electrode side switching member SWn via the negative-electrode side circuit breaker 36.

The processing unit 56 is then kept standby until the time difference TL elapses from when the negative-electrode side circuit breaker 36 is switched (No at S110). If the time difference TL has elapsed from when the negative-electrode side circuit breaker 36 is switched (Yes at S110), the processing unit 56 switches the pre-charge circuit breaker 40 to the closed state, for example (S112). As a result, the positive-electrode side of the battery system 30 becomes connected to the positive-electrode side switching member SWp via the pre-charge circuit breaker 40. As a result, the battery system 30 supplies a small current to the capacitor and the like in the inverter provided to the PCS 12 via the pre-charge resistor 42, so that the capacitor is charged thereby.

The processing unit 56 is then kept standby until the time difference TL elapses from when the pre-charge circuit breaker 40 is switched (No at S114). If the time difference TL has elapsed from when the pre-charge circuit breaker 40 is switched (Yes at S114), the processing unit 56 switches the positive-electrode side circuit breaker 38 to the closed state (S116). As a result, the positive-electrode side of the battery system 30 becomes connected to the positive-electrode side switching member SWp via the positive-electrode side circuit breaker 38. As a result, the battery system 30 supplies the power to the PCS 12, or receives the power supply from the PCS 12. The processing unit 56 then ends the switching process.

Some advantageous effects achieved by the embodiment will now be explained.

Figure 3:
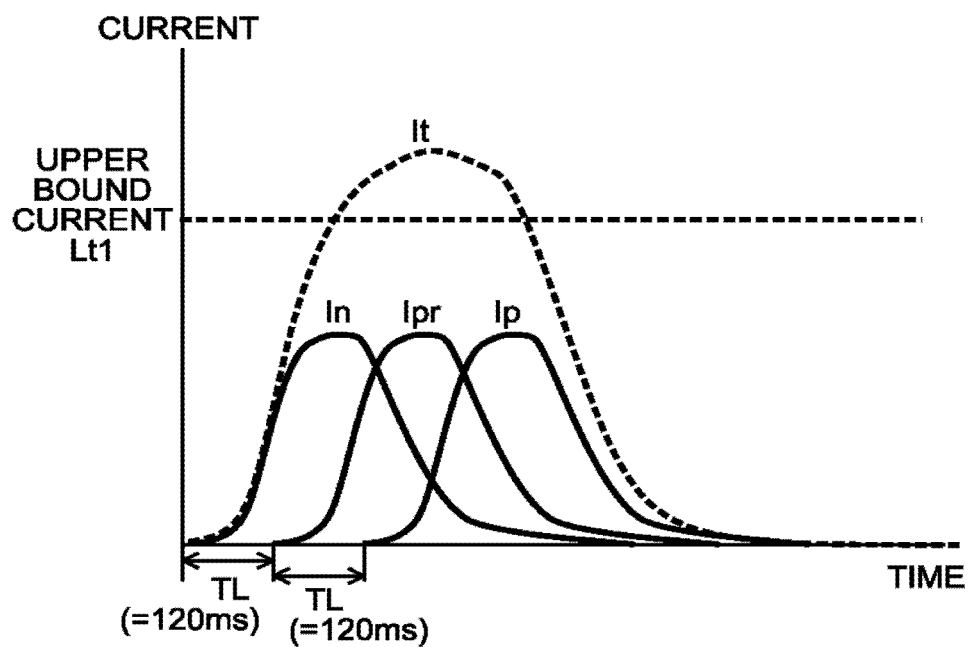
FIG. 3 is a graph for explaining the size of a total current flowing through circuit breakers in a comparative configuration to be compared with the embodiment.
Figure 4:
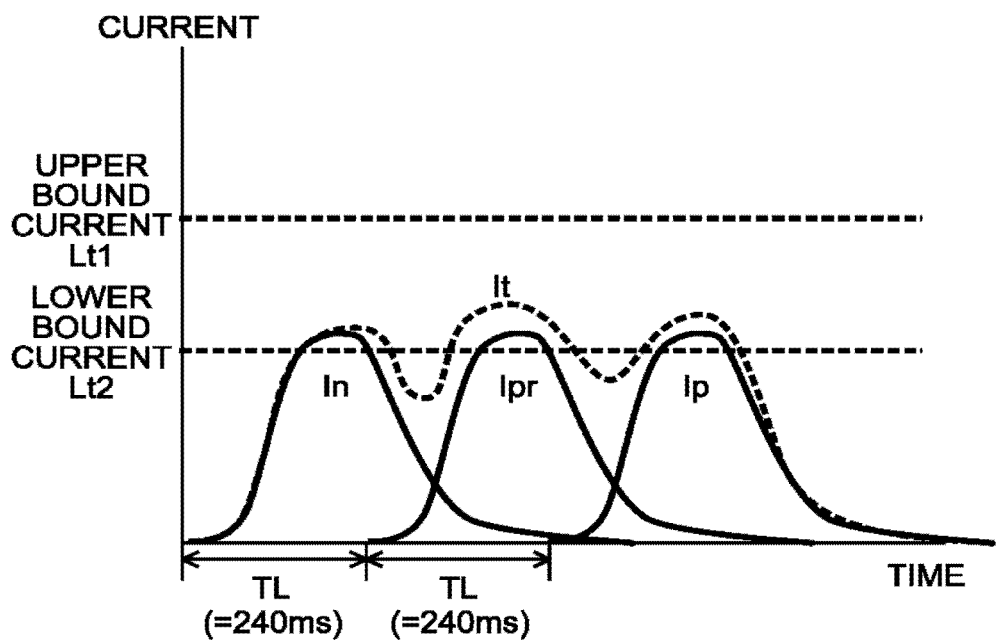
FIG. 4 is a graph for explaining the size of a total current flowing through circuit breakers in a storage battery device according to the embodiment.

FIG. 3 is a graph for explaining the size of the total current flowing through circuit breakers 36, 38, and 40 in a comparative configuration to be compared with the embodiment. FIG. 4 is a graph for explaining the size of the total current flowing through the circuit breakers 36, 38, and 40 in the storage battery device 18 according to the embodiment. In FIGS. 3 and 4, "In" represents the current profile of the current flowing through the negative-electrode side circuit breaker 36, and "Ipr" represents the current profile of the current flowing through the pre-charge circuit breaker 40. "Ip" represents the current profile of the current flowing through the positive-electrode side circuit breaker 38. The comparative configuration is the same as that according to the embodiment except that the time difference TL between the timings at which the current is started being supplied to the circuit breakers 36, 38, and 40.

As illustrated in FIG. 3, in the comparative configuration in which the time difference TL between the timings at which the current is supplied to the circuit breakers 36, 38, and 40 is short (e.g., a time difference TL of 120 milliseconds), the peak value of the total current It that is the sum of the currents flowing through the circuit breakers 36, 38, and 40 is equal to or higher than the upper bound current Lt1. As a result, the current supply falls short, the BMU 44 or the like may experience a failure.

As illustrated in FIG. 4, in the storage battery device 18 according to the embodiment, because the time difference TL between the timings at which the current is supplied to the circuit breakers 36, 38, and 40 is long (e.g., a time difference TL of 240 milliseconds), the peak value of the total current It is kept lower than the upper bound current Lt1. As a result, the storage battery device 18 according to the embodiment can suppress a shortage in the current supply, so that the chances of the BMU 44 and the like experiencing a failure can be reduced. In particular, the storage battery device 18 according to the embodiment can suppress a shortage in the current supply even when the circuit breakers 36, 38, and 40 are those requiring a high current, e.g., those with an economizer circuit. Furthermore, in the storage battery device 18 according to the embodiment, because the time difference TL is set in such a manner that the peak value of the total current It is kept equal to or higher than the lower bound current Lt2, it is possible to suppress an extension of time required in switching all of the circuit breakers 36, 38, and 40.

The arrangement, the relations of connections, the numbers, and the shapes of the elements according to the embodiment described above may be changed as appropriate. The order of the steps included in the process described above may also be changed, or some of the steps may be omitted.

Explained in the embodiment described above is an example in which the negative-electrode side circuit breaker 36, the positive-electrode side circuit breaker 38, and the pre-charge circuit breaker 40 are provided, but this embodiment may also be applied to a storage battery device that is provided with any two of the negative-electrode side circuit breaker 36, the positive-electrode side circuit breaker 38, and the pre-charge circuit breaker 40, or that is provided with four or more circuit breakers.

For example, the storage battery device may include two circuit breakers (e.g., the negative-electrode side circuit breaker 36 and the positive-electrode side circuit breaker 38), without including the pre-charge circuit breaker 40. In such a configuration, the processing unit 56 in the BMU 44 supplies the power to the negative-electrode side circuit breaker 36 and the positive-electrode side circuit breaker 38 in sequence with the power supplied to the positive-electrode side circuit breaker 38 offset relative to the power supplied to the negative-electrode side circuit breaker 36 by a time period equal to or longer than a time difference required for the total current It that is the sum of the current profile In(t) of the negative-electrode side circuit breaker 36 and the current profile Ip(t) of the positive-electrode side circuit breaker 38 to reach the upper bound current Lt1. It is preferable for the processing unit 56 to supply power to the negative-electrode side circuit breaker 36 and the positive-electrode side circuit breaker 38 in sequence with the power supplied to the positive-electrode side circuit breaker 38 offset relative to the power supplied to the negative-electrode side circuit breaker 36 by a time period that is less than a time difference required for the total current It that is the sum of the current profile In(t) of the negative-electrode side circuit breaker 36 and the current profile Ip(t) of the positive-electrode side circuit breaker 38 to reach the lower bound current Lt2 that is set as the lower bound of the current.

Furthermore, in a configuration in which the storage battery device includes four or more circuit breakers, a fourth circuit breaker may be provided between the ground terminals of the negative-electrode side circuit breaker 36, the positive-electrode side circuit breaker 38, and the pre-charge circuit breaker 40, and the ground potential.

While some embodiments of the present invention are explained above, these embodiments are provided by way of example only, and are not intended to limit the scope of the present invention in any way. These novel embodiments may be implemented as any other various embodiments, and various omissions, replacements, and changes are still possible within the scope not deviating from the spirit of the present invention. These embodiments and the modifications thereof fall within the scope of the present invention, and within the scope of the invention defined by the appended claims and equivalent thereof.

The invention claimed is:

1. A storage battery device comprising:
   a battery unit that includes one or more storage batteries;
   a first circuit breaker that switches between connecting and disconnecting a first-electrode side of the battery unit and an external device;
   a second circuit breaker that switches between connecting and disconnecting a second-electrode side of the battery unit and the external device; and
   a control unit that controls connection and disconnection by supplying power to the first circuit breaker and the second circuit breaker, wherein
   the control unit supplies power to the first circuit breaker and the second circuit breaker in sequence with the power supplied to the second circuit breaker offset relative to the power supplied to the first circuit breaker by a time period equal to or longer than a time difference required for a sum of currents flowing through the first circuit breaker and the second circuit breaker to reach an upper bound current that is set as an upper bound of a current.

2. The storage battery device according to claim 1, wherein the control unit supplies power to the first circuit breaker and the second circuit breaker in sequence with the power supplied to the second circuit breaker offset relative to the power supplied to the first circuit breaker by the time period less than a time difference required for the sum of the currents flowing through the first circuit breaker and the second circuit breaker to reach a lower bound current that is set as a lower bound of the current.

3. The storage battery device according to claim 1, further comprising:
   a third circuit breaker that is connected in parallel with the second circuit breaker on the second-electrode side of the battery unit, and that switches between connecting and disconnecting the second electrode of the battery unit and the external device; and
   a preliminary resistor that is serially connected to the third circuit breaker, wherein
   the control unit supplies power to the first circuit breaker, the second circuit breaker, and the third circuit breaker in sequence with each successive supplying of power offset by the time period equal to or longer than a time difference required for a sum of currents flowing through the first circuit breaker, the second circuit breaker, and the third circuit breaker to reach the upper bound current.

4. The storage battery device according to claim 3, wherein the control unit supplies power to the first circuit breaker, the second circuit breaker, and the third circuit breaker in sequence with each successive supplying of power offset by the time period less than a time difference required for the sum of currents flowing through the first circuit breaker, the second circuit breaker, and the third circuit breaker to reach a lower bound current set as a lower bound of the current.

5. A storage battery device control method comprising:
   a step of supplying power for switching between connecting and disconnecting of a first circuit breaker connected to a first-electrode side of a battery unit including one or more storage batteries, and an external device;

a step of supplying power for switching between connecting and disconnecting of a second circuit breaker connected to a second-electrode side of the battery unit and an external device, offset by a time period equal to or longer than a time difference required for a sum of a current flowing through the second circuit breaker and a current flowing through the first circuit breaker to reach an upper bound current that is set as an upper bound of a current.

6. A computer program product comprising a non-transitory computer-readable medium including a program causing a computer to execute:

acquiring information related to an upper bound current that is set as an upper bound of a current; and controlling a first circuit breaker switching between connecting and disconnecting a first-electrode side of a battery unit including one or more storage batteries and an external device, and a second circuit breaker switching between connecting and disconnecting a second-electrode side of the battery unit and an external device, wherein at the controlling, after switching between connecting and disconnecting by supplying power to the first circuit breaker, switching between connecting and disconnecting by supplying power to the second circuit breaker is executed offset by a time period equal to or longer than a time difference required for a sum of currents flowing through the first circuit breaker and the second circuit breaker to reach the upper bound current that is set as the upper bound of the current.

* * * * *

UNITED STATES PATENT AND TRADEMARK OFFICE
CERTIFICATE OF CORRECTION

PATENT NO. : 10,581,238 B2
APPLICATION NO. : 16/082898
DATED : March 3, 2020
INVENTOR(S) : Ryo Okabe et al.

Page 1 of 1

It is certified that error appears in the above-identified patent and that said Letters Patent is hereby corrected as shown below:

On the Title Page

Item (73), the 2nd Assignee's name is incorrect. Item (73) should read:
-- (73) Assignees: Kabushiki Kaisha Toshiba, Minato-ku (JP); Toshiba Infrastructure Systems & Solutions Corporation, Kawasaki-shi (JP) --

Signed and Sealed this
Seventh Day of July, 2020

Andrei Iancu
*Director of the United States Patent and Trademark Office*